US011843386B1

(12) United States Patent
Dalena

(10) Patent No.: US 11,843,386 B1
(45) Date of Patent: Dec. 12, 2023

(54) LATCHED COMPARATOR CIRCUITRY WITH REDUCED CLOCK FEEDTHROUGH

(71) Applicant: Apple Inc., Cupertino, CA (US)

(72) Inventor: Francesco Dalena, Leghorn (IT)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 17/899,036

(22) Filed: Aug. 30, 2022

(51) Int. Cl.
*H03K 5/00* (2006.01)
*H03K 5/24* (2006.01)
*H03K 3/037* (2006.01)

(52) U.S. Cl.
CPC ......... *H03K 5/2481* (2013.01); *H03K 3/0377* (2013.01); *H03K 5/249* (2013.01); *H03K 5/2427* (2013.01); *H03K 5/2454* (2013.01)

(58) Field of Classification Search
CPC .. H03K 5/2481; H03K 5/2427; H03K 3/0377; H03K 5/2454; H03K 5/249
See application file for complete search history.

(56) References Cited

U.S. PATENT DOCUMENTS

| | | | | |
|---|---|---|---|---|
| 4,910,713 | A * | 3/1990 | Madden | G11C 11/419 365/189.11 |
| 5,650,971 | A * | 7/1997 | Longway | G11C 7/062 365/207 |
| 6,201,418 | B1 * | 3/2001 | Allmon | H03K 3/356173 327/52 |
| 7,339,403 | B2 * | 3/2008 | Chen | H03K 5/19 326/97 |
| 2006/0189049 | A1 * | 8/2006 | Afentakis | H03K 3/3565 257/369 |
| 2017/0155386 | A1 * | 6/2017 | Yuan | H03F 3/45278 |
| 2019/0286180 | A1 * | 9/2019 | Sakaguchi | H03F 3/45183 |
| 2020/0266781 | A1 * | 8/2020 | Finocchiaro | B60R 11/04 |
| 2020/0389160 | A1 * | 12/2020 | Almansouri | H03K 17/6872 |

(Continued)

OTHER PUBLICATIONS

Pierluigi Nuzzo et al., Noise Analysis of Regenerative Comparators for Reconfigurable ADC Architectures, IEEE Transactions on Circuits and Systems—I: Regular Papers, Jul. 6, 2008, pp. 1441-1454, vol. 55, No. 6, IEEE.

(Continued)

*Primary Examiner* — Tuan T Lam
(74) *Attorney, Agent, or Firm* — TREYZ LAW GROUP; Jason Tsai

(57) ABSTRACT

An integrated circuit can include latched comparator circuitry. The latched comparator circuitry may include first and second input transistors configured to receive an input signal, first and second cross-coupled inverting circuits, reset transistors, and a current pulse generator. The first and second inverting circuits may each include a pull-up transistor and a pull-down transistor. The first input transistor may be coupled between the pull-up and pull-down transistors in the first inverting circuit. The second input transistor may be coupled between the pull-up and pull-down transistors in the second inverting circuit. The reset transistors may be coupled in parallel with the pull-up transistors and may receive a clock signal. The current pulse generator may receive the clock signal and generate current pulse signals in response to detecting edges in the clock signal. Latched comparator circuitry configured and operated in this way can provide reduced clock kickback noise.

20 Claims, 7 Drawing Sheets

(56) References Cited

U.S. PATENT DOCUMENTS

2021/0343355 A1* 11/2021 Chung ................. G11C 17/165
2021/0384874 A1* 12/2021 Sun ...................... H03F 1/0227
2022/0158650 A1* 5/2022 Al-Qadasi ............ H03M 1/361

OTHER PUBLICATIONS

Masato Yoshioka et al., A 10b 50MS/s 820 µW SAR ADC with On-Chip Digital Calibration, 2010 IEEE International Solid-State Circuits Conference, Feb. 10, 2010, pp. 384-386, Session 21.4, IEEE, San Francisco, CA.
Behzad Razavi, The StrongARM Latch, IEEE Solid-State Circuits Magazine, Jun. 25, 2015, pp. 12-17, vol. 7, No. 2, IEEE.

* cited by examiner

LATCHED COMPARATOR CIRCUITRY WITH REDUCED CLOCK FEEDTHROUGH

FIELD

Embodiments described herein relate generally to integrated circuits and, more particularly, to integrated circuits with a latched comparator.

BACKGROUND

Integrated circuits often include comparators. In applications that require low power consumption, the comparators can be implemented as latched comparators. Latched comparators are comparators that are triggered by an external clock signal and are sometimes referred to as clock-triggered latched comparators.

It can be challenging to design a latched comparator. Conventional latched comparators are subject to a clock feedthrough problem, where an internal voltage within the latched comparator spikes when the clock signal goes high and dips when the clock signal goes low. Clock feedthrough can limit the performance of the latched comparator. It is within this context that the embodiments herein arise.

SUMMARY

An electronic device may include an integrated circuit having latched comparator circuitry. The latched comparator circuitry may include a first inverting circuit, a second inverting circuit cross-coupled with the first inverting circuit, a first input transistor connected in series between pull-up and pull-down transistors in the first inverting circuit, and a second input transistor connected in series between pull-up and pull-down transistors in the second inverting circuit. The latched comparator circuitry can further include precharge transistors coupled in parallel with the pull-up transistors. Output drivers can be coupled to output nodes of the first and second inverting circuits. The precharge transistors can be controlled by a clock signal and can be used to reset the output nodes. By connecting the input transistors between the pull-up and pull-down transistors in the inverting circuits, the output impedance of the input transistors can be increased, which helps to reduce kickback noise from the precharge transistors. If desired, the input transistors can receive adjustable body biasing voltages for compensating an offset voltage of the latched comparator circuitry. Desired adjustable body bias voltage levels can be obtained during calibration operations.

A pulse generator such as a current pulse generator can be coupled to the first and second inverting circuits. The current pulse generator can be used to generate a current pulse signal having a pulse duration during which the first and second inverting circuits are used to sense and amplify a small differential input signal received by the input transistors to rail-to-rail voltage levels. The current pulse generation can generate a pulse signal in response to detecting an edge in the clock signal controlling the precharge transistors. Selectively activating the latched comparator circuitry only during the pulse duration of the current pulse signal output by the current pulse generator can help minimize power consumption.

Further features of the invention, its nature and various advantages will be more apparent from the accompanying drawings and following detailed description.

DETAILED DESCRIPTION

This relates to an integrated circuit having latched comparator circuitry. The latched comparator circuitry may include first and second input transistors, first and second clocking transistors, a regeneration latch, and a current pulse generator. The regeneration latch may include a first pair of series-connected regeneration transistors and a second pair of series-connected regeneration transistors. The first input transistor is coupled between the first pair of series-connected regeneration transistors. The second input transistor is coupled between the second pair of series-connected regeneration transistors. The first clocking transistor is coupled to the first input transistor and also to a first output port of the latched comparator circuitry. The second clocking transistor is coupled to the second input transistor and also to a second output port of the latched comparator circuitry. The first output port may be coupled to a first Schmitt trigger circuit. The second output port may be coupled to a second Schmitt trigger circuit.

The regeneration latch may be coupled between a positive power supply line and a tail node. The current pulse generator may be coupled to the tail node. The current pulse generator, the first clocking transistor, and the second clocking transistor may all be configured to receive the same clock signal. The first and second input transistors can have body terminals configured to receive a tunable bias voltage from a comparator offset compensation circuit. Configured and operated in this way, the latched comparator circuitry can reduce the clock feedthrough effect without compromising performance.

Figure 1:
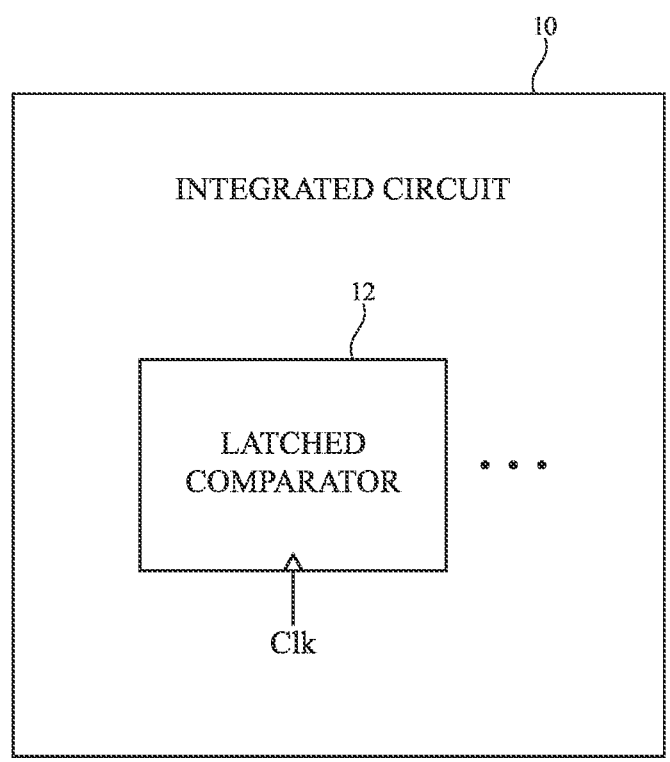
FIG. 1 is a diagram of an illustrative integrated circuit having a latched comparator in accordance with some embodiments.

FIG. 1 is a diagram of an illustrative integrated circuit device such as integrated circuit having a latched comparator such as latched comparator 12. Integrated circuit 10 can represent one or more processors such as a microprocessor, a microcontroller, a digital signal processor, an image signal processor, a host processor, a baseband processor, an application processor, a central processing unit (CPU), a graphics processing unit (GPU), a power management integrated circuit (PMIC), a field-programmable gate array or programmable logic device, a sound (audio) chip, a wireless communications processor such as a radio-frequency transceiver chip, an artificial intelligence or machine learning processor, a combination of these circuits, or other types of integrated circuits.

Latched comparator 12 may have an amplifier portion and a latch portion. The amplifier portion may be used to sense and amplify a small differential voltage at the input of the latched comparator. The latch portion may provide a positive feedback loop to further drive the amplified voltage at an output of the latched comparator to the power supply rails and to keep the output at those levels. Latched comparator 12 may also be a clock-triggered circuit. As shown in FIG. 1, latched comparator may receive at least one clock signal Clk. Latched comparator 12 may perform the sensing, amplifying, and latching functions in response to signal Clk being driven or pulsed high. In general, integrated circuit 10 may include any number of latched comparators 12. Latched comparators can be used in a variety of data converters (e.g., in flash analog-to-digital converters, in successive approximation register analog-to-digital converters, or other types of data converters), in various high-speed communications interfaces, in charge pump circuits, in sample-and-hold circuits, oscillators, and other types of mixed-signal circuits.

Figure 2:
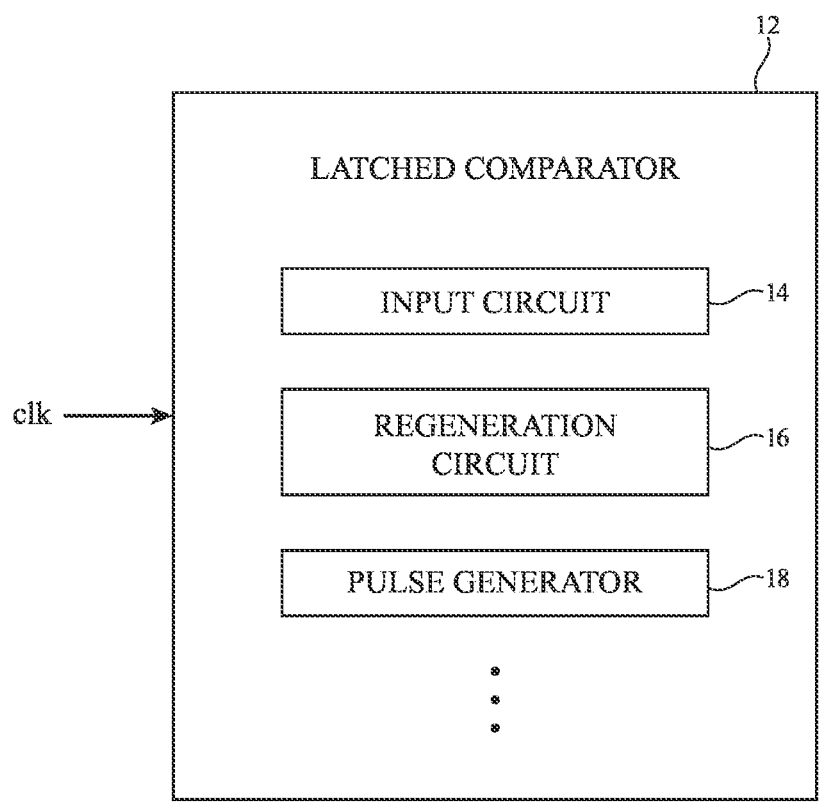
FIG. 2 is a schematic diagram of an illustrative latched comparator in accordance with some embodiments.

FIG. 2 is a block diagram of an illustrative latched comparator 12. Latched comparator 12 is sometimes referred to as latched comparator circuitry. As shown in FIG. 2, latched comparator circuity 12 may include an input circuit such as input circuit 14, a regeneration circuit such as regeneration circuit 16, a pulse generation circuit such as pulse generator 18, and optionally other electronic components. Input circuit 14 may include one or more transistors configured to receive input signals arriving at latched comparator circuitry 12. Regeneration circuit 16 may include one or more transistors configured to form a latch that drives the output of latched comparator circuit 12 to digital high and low values. Pulse generator 18 may generate a pulse signal in response to clock signal Clk being asserted or pulsing high. Pulse generator 18 may generate a current pulse signal or a voltage pulse signal in response to detecting a rising edge in the clock signal or in response to detecting a falling edge in the clock signal. Latched comparator circuitry 12 might only be active in the presence of the pulse signal output from pulse generator 18. Operating latched comparator circuitry 12 by triggering the amplifier and latching functions using an external clock Clk can help substantially reduce the power consumption of circuitry 12.

Figure 3:
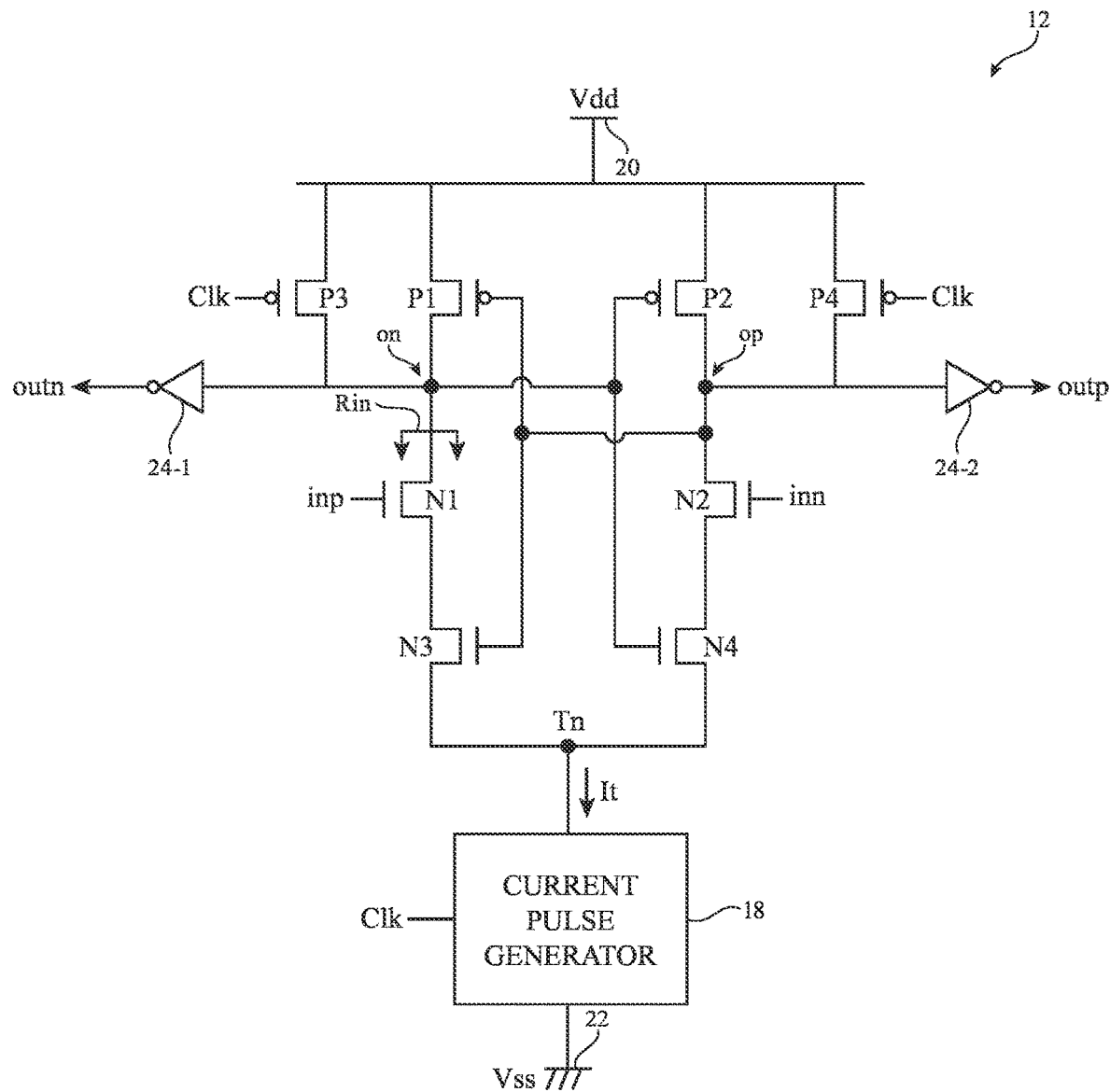
FIG. 3 is a circuit diagram of an illustrative latched comparator having cross-coupled regeneration transistors and input transistors coupled between the regeneration transistors in accordance with some embodiments.

FIG. 3 is a circuit diagram showing one suitable implementation of latched comparator circuitry 12 in accordance with an embodiment. As shown in FIG. 3, latched comparator circuitry 12 may include n-type transistors (e.g., n-channel metal-oxide-semiconductor or NMOS devices) such as transistors N1, N2, N3, and N4 and p-type transistors (e.g., p-channel metal-oxide-semiconductor or PMOS devices) such as transistors P1, P2, P3, and P4. Transistor N1 has a gate terminal coupled to a first input terminal inp of latched comparator circuitry 12, whereas transistor N2 has a gate terminal coupled to a second input terminal inn of latched comparator circuitry 12. Input terminals inp and inn collectively serve as a differential input port of latched comparator circuitry 12. A differential signal (e.g., a differential voltage signal) can be received at the differential input port of circuitry 12. Transistors N1 and N2 having gate terminals configured to receive an input signal are sometimes referred to and defined herein as input transistors.

Transistor N3 has a drain terminal, a gate terminal, and a source terminal that is coupled to a tail node Tn. Transistor P1 has a source terminal that is coupled to a positive power supply line 20 (e.g., a positive power supply terminal on which positive power supply voltage Vdd is provided), a drain terminal that is coupled to the drain terminal of transistor N3, and a gate terminal that is shorted to the gate terminal of transistor N3. The drain terminal of transistor P1 is connected to a first output node on within circuitry 12. Transistors N3 is coupled in series with transistor P1. Series-connected transistors N3 and P1 having their gates connected are sometimes referred to as a first inverting circuit. The terms "source" and "drain" are sometimes used interchangeably when referring to current-conducting terminals of a metal-oxide-semiconductor transistor. The source and drain terminals are therefore sometimes referred to as "source-drain" terminals (e.g., a transistor has a gate terminal, a first source-drain terminal, and a second source-drain terminal).

Transistor N4 has a drain terminal, a gate terminal, and a source terminal that is coupled to tail node Tn. Transistor P2 has a source terminal that is coupled to the positive power supply Vdd line 20, a drain terminal that is coupled to the drain terminal of transistor N4, and a gate terminal that is shorted to the gate terminal of transistor N4. The drain terminal of transistor P2 is connected to a second output node op within circuitry 12. Transistors N4 is coupled in series with transistor P2. Series-connected transistors N4 and P2 having their gates connected are sometimes referred to as a second inverting circuit.

The gate (input) of the second inverting circuit is coupled to output node on at the first inverting circuit (sometimes referred to as the output node of the first inverting circuit), whereas the gate (input) of the first inverting circuit is coupled to output node op at the second inverting circuit (sometimes referred to as the output node of the second inverting circuit). Arranged in this way, the first and second inverting circuits are sometimes referred to as a pair of cross-coupled inverting circuits forming a latch. Cross-coupling two inverting circuits together in this way forms a positive feedback loop, which provides regenerative properties that allow the latch to quickly drive output nodes on and op towards either the positive power supply voltage Vdd or a ground voltage Vss (i.e., to pull up the output terminals towards the positive power supply rail or pull down the output terminals towards the ground power supply rail). Transistors N3 and N4 are therefore sometimes referred to as latch or regeneration (regenerative) pull-down transistors, whereas transistors P1 and P2 are sometimes referred to as latch or regeneration (regenerative) pull-up transistors. Transistors N3, N4, P1, and P2 can be referred to as regenerative latch transistors. The two cross-coupled inverting circuits (e.g., transistors N3, N4, P1 and P2) can also sometimes be referred to collectively as a regenerative latch or a latch portion of circuitry 12.

Transistor P3 may have a source terminal coupled to power supply line 20, a drain terminal coupled to output node on, and a gate terminal configured to receive clock signal Clk. Transistor P3 is said to be coupled in parallel with pull-up transistor P1. When clock signal Clk is driven low, p-type transistor P3 (e.g., an active-low transistor that is enabled when its gate input is low) is turned on, which pulls output node on up towards positive power supply voltage Vdd. Similarly, transistor P4 may have a source terminal coupled to power supply line 20, a drain terminal coupled to output node op, and a gate terminal configured to receive clock signal Clk. Transistor P4 is said to be coupled in parallel with pull-up transistor P1. When clock signal Clk is driven low, p-type transistor P4 (e.g., an active-low transistor that is enabled when its gate input is low) is turned on, which pulls output node op up towards positive power supply voltage Vdd. Transistors P3 and P4 having gate terminals configured to receive clock signal Clk are sometimes referred to and defined herein as clocking transistors.

Node on may be coupled to a first output terminal outn of latched comparator circuitry 12 via a first buffer 24-1. Node op may be coupled to a second output terminal outp of latched comparator circuitry 12 via a second buffer 24-2. Output terminals outn and outp may serve collectively as a differential output port for latched comparator circuitry 12. As an example, output buffers 24-1 and 24-1 can be implemented as inverters. As another example, output buffers 24-1 and 24-2 can be implemented as Schmitt triggers (e.g., inverting circuits with hysteresis or memory). The use of Schmitt triggers as output buffers can help reduce leakage in latched comparator circuitry 12. In general, any type of output buffer or driver circuits can be used for 24-1 and 24-2.

Pulse generator such as current pulse generator 18 can be coupled between the tail node Tn and a ground power supply line 22 (e.g., a ground line on which ground power supply voltage Vss is provided). A current pulse generator can be defined herein as a circuit that produces current pulses. Current pulse generator 18 also has an input configured to receive clock signal Clk. Pulse generator 18 may be configured to sink a current pulse It in response to detecting a rising edge in signal Clk. In the absence of current pulse It, no current can flow into tail node Tn, which deactivates or disabled latched comparator circuitry 12. Activating latched comparator circuitry 12 only when tail current It is pulsed high can dramatically reduce the power consumption of circuitry 12.

Conventional latched comparators are susceptible to clock feedthrough, a phenomenon in which rising and falling edges of the clock signal can be capacitively coupled onto the latch comparator output terminals. This capacitive signal coupling can cause the comparator output to temporarily spike above Vdd at a rising clock edge and the output to temporarily dip below Vss (e.g., below zero volts) at a falling clock edge. This clock feedthrough effect is sometimes referred to as clock kickback. If care is not taken, clock feedthrough/kickback can limit the performance of a latched comparator. One way of increasing the performance of a latched comparator is to increase the current flow through the two input branches of the latched comparator. The current flow can be increased by augmenting the size of the input transistors. Increasing the size of the input transistors will, however, increase the total capacitance in the latched comparator, which again degrades the performance of the overall latched comparator.

To reduce the total internal capacitance of latched comparator circuitry 12 without compromising on the amount of current flow, the input transistors are interposed between the pull-up and pull-down latch transistors. As shown in FIG. 3, input transistor N1 has a drain terminal coupled to the drain terminal of pull-up transistor P1 and has a source terminal coupled to the drain terminal of pull-down transistor N3. Similarly, input transistor N2 has a drain terminal coupled to the drain terminal of pull-up transistor P2 and has a source terminal coupled to the drain terminal of pull-down transistor N4. Coupling transistor N3 at the source terminal of input transistor N1 can help increase the impedance Rin looking into the drain of N1. Similarly, coupling transistor N4 at the source terminal of input transistor N2 can help increase the impedance looking into the drain of N2. Increasing the impedance Rin in this way can help mitigate the clock feedthrough effect or lower the clock kickback noise caused by toggling of the clock signal.

Figure 4:
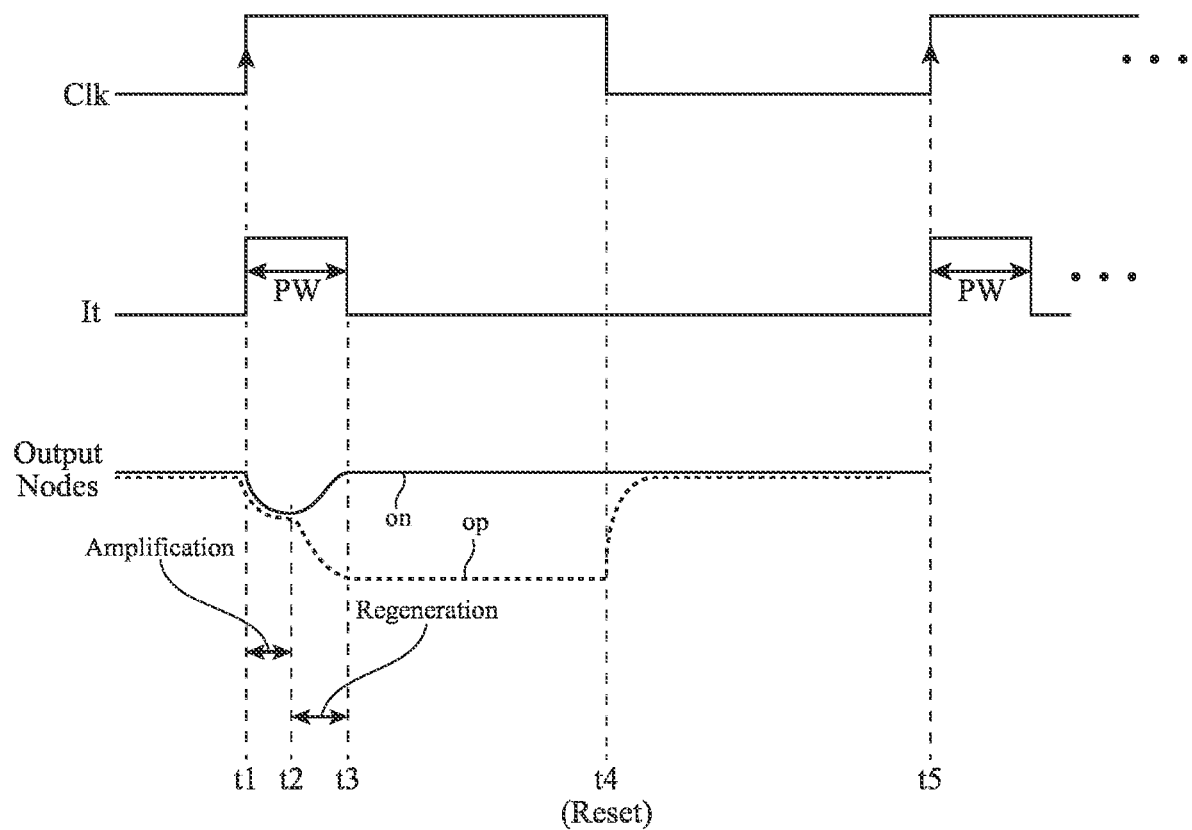
FIG. 4 is a timing diagram of illustrative waveforms showing the operation of a latched comparator of the type shown in FIG. 3 in accordance with some embodiments.

FIG. 4 is a timing diagram illustrating the operation of latched comparator circuitry 12 of the type described in connection with FIG. 3. In response to detecting a rising clock edge in signal Clk at time t1, pulse generator 18 may generate a current pulse It having a pulse width PW. This current pulse signal It may represent the amount of current flowing down into the tail node Tn at any point in time (see FIG. 3). In the example of FIG. 4, clock signal Clk is shown to have a 50% duty cycle. This is merely illustrative. In general, signal Clk can have a duty cycle that is greater than 50%, less than 50%, a 25% duty cycle, 25-50% duty cycle, a 75% duty cycle, a 50-75% duty cycle, or other duty cycle.

In comparison, the pulse width PW of the current pulse signal It may be less than the high clock phase of signal Clk. As examples, the current pulse may have less than 10% duty cycle (i.e., pulse width PW may be no more than 10% of one clock period), less than 5% duty cycle (i.e., pulse width PW may be no more than 5% of one clock period), less than 2% duty cycle (i.e., pulse width PW may be no more than 2% of one clock period), less than 1% duty cycle (i.e., pulse width PW may be no more than 1% of one clock period), 1-10% duty cycle, or other range that is less than the duty cycle of signal Clk. Since the latched comparator is only actively consuming power when signal It is pulsed high, the overall power consumption of the latched comparator can be dramatically reduced by using a relatively short pulse width PW. The example of FIG. 4 in which the current pulse signal It is triggered from the positive (rising) edge of the clock signal is merely illustrative. If desired, current pulse signal It can alternatively be triggered from the negative (falling) edge of the clock signal.

The latched comparator circuitry 12 may be operable in at least three phases. In response to signal It being pulsed high, the input transistors N1 and N2 may be configured to sense a small differential voltage at the input port of circuitry 12 and to amplify the small voltage differential. During this time, output nodes on and op may be pulled down, albeit at slightly different speeds due to the voltage difference at the differential input port. In the example of FIG. 4, output node op is pulled down slightly faster than output node on, but the opposite scenario can also occur depending on the polarity of the input signal detected at the differential input port of circuitry 12. The time period from t1 to t2 can be referred to as the amplification phase. Input transistors N1 and N2 may therefore sometimes also be referred to as amplification or amplifying transistors.

Once the voltage on the output nodes on and op crosses a certain threshold, the regenerative latch portion of comparator circuitry 12 is activated. The positive feedback property of the cross-coupled regenerative latch can then drive the output nodes to opposing power supply rails. In the example of FIG. 4, by time t3, output node on should be driven to the positive supply rail (e.g., to positive power supply voltage Vdd) while output node op should be driven the ground supply rail (e.g., to ground power supply voltage Vss). The time period from t2 to t3 can be referred to as the regeneration phase. The pulse width PW of signal It should be long enough such that the output nodes are fully driven to logic "1" or logic "0" by the end of the regenerative phase.

The falling edge of the clock signal (at time t4) then triggers the start of a reset phase. When the clock signal is driven low, the clocking transistors P3 and P4 are both turned on (activated), which drives both output nodes on and op back up to power supply voltage Vdd. Clocking transistors P3 and P4 can therefore sometimes be referred to as reset transistors or precharge transistors. These operations can then be repeated at the next cycle (at time t5) to detect the next input voltage, and so on.

Figure 5:
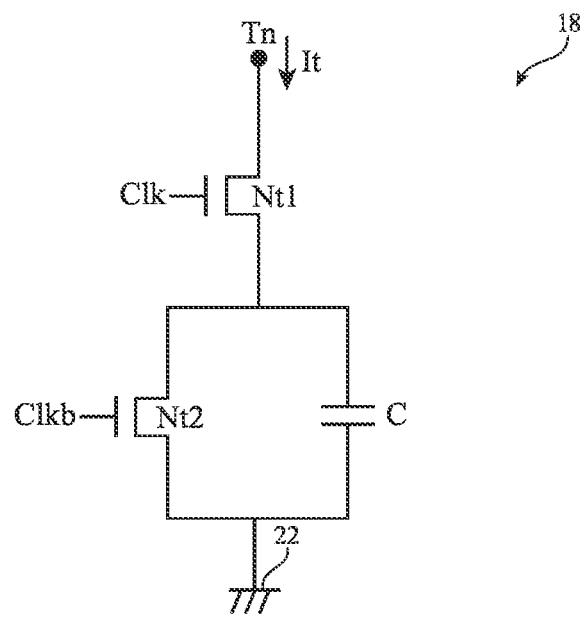
FIGS. 5 and 6 are diagrams of illustrative current pulse generation circuits in accordance with some embodiments.

The current pulse generator 18 in latched comparator circuitry 12 of the type shown in FIGS. 2 and 3 can be implemented in various ways. FIG. 5 shows one embodiment of current pulse generator 18. As shown in FIG. 5, current pulse generator 18 may include a first tail transistor Nt1, a second tail transistor Nt2, and a capacitor C. Tail transistors Nt1 and Nt2 can be n-type transistors (e.g., NMOS devices). The first tail transistor Nt1 can have a drain terminal coupled to tail node Tn, a gate terminal configured to receive the clock signal Clk, and a source terminal. The second tail transistor Nt2 can have a drain terminal coupled to the source terminal of the first tail transistor Nt1, a gate terminal configured to receive signal Clkb (e.g., an inverted version of signal Clk), and a source terminal coupled to ground line 22.

Stacking transistors Nt1 and Nt2 in series can also help minimize the amount of leakage in circuitry 12 during the off periods (e.g., to reduce the leakage current when the current pulse signal is low). Capacitor C can have a first terminal coupled to the drain terminal of transistor Nt2 and can have a second terminal coupled to ground line 22. Configured in this way, transistor Nt2 can precharge capacitor C during the low clock phase (e.g., when signal Clk is low). When signal Clk is pulsed high, transistor Nt2 is turned off while transistor Nt1 is turned on to discharge the stored charge on capacitor C in the form of a short current pulse.

Figure 6:
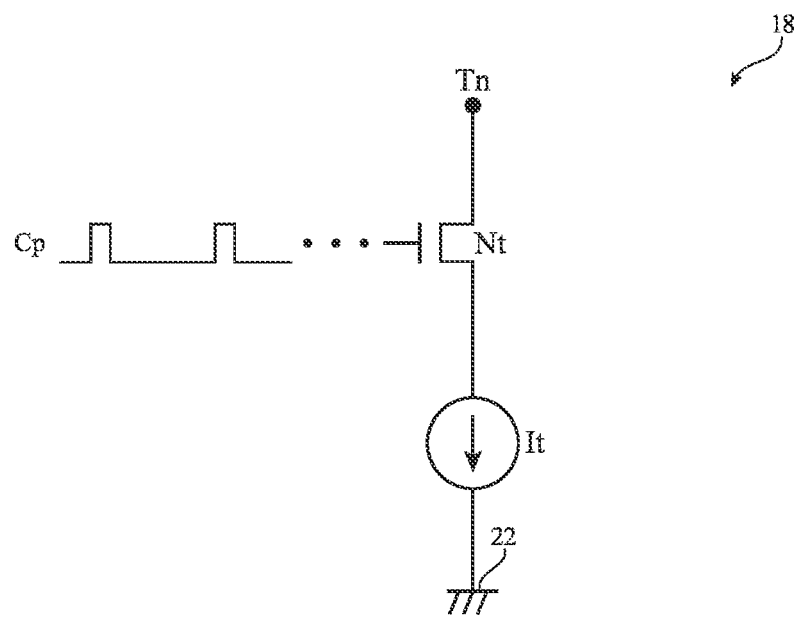

FIG. 6 shows another embodiment of current pulse generator 18. As shown in FIG. 6, current pulse generator 18 may include a tail transistor Nt and a current sink (sometimes also referred to as a current source). The current sink can be configured to provide tail current It whenever transistor Nt is switched into use. Tail transistor N1 can have a drain terminal coupled to tail node Tn, a source terminal coupled to the current sink, and a gate terminal configured to receive clock pulses Cp. The clock pulses Cp can have pulse widths PW (see, e.g., FIG. 4). The clock pulses can be generated using a voltage pulse generator that is triggered by rising edges in the clock signal. If desired, the order of tail transistor Nt and the current source can be swapped. The examples of current pulse generator 18 shown in FIGS. 5 and 6 are illustrative and not intended to limit the scope of the present embodiments. If desired, other types of pulse generation circuits can also be used within latched comparator circuitry 12. If desired, current pulse generator 18 can also be implemented using one or more p-type tail transistors.

Figure 7:
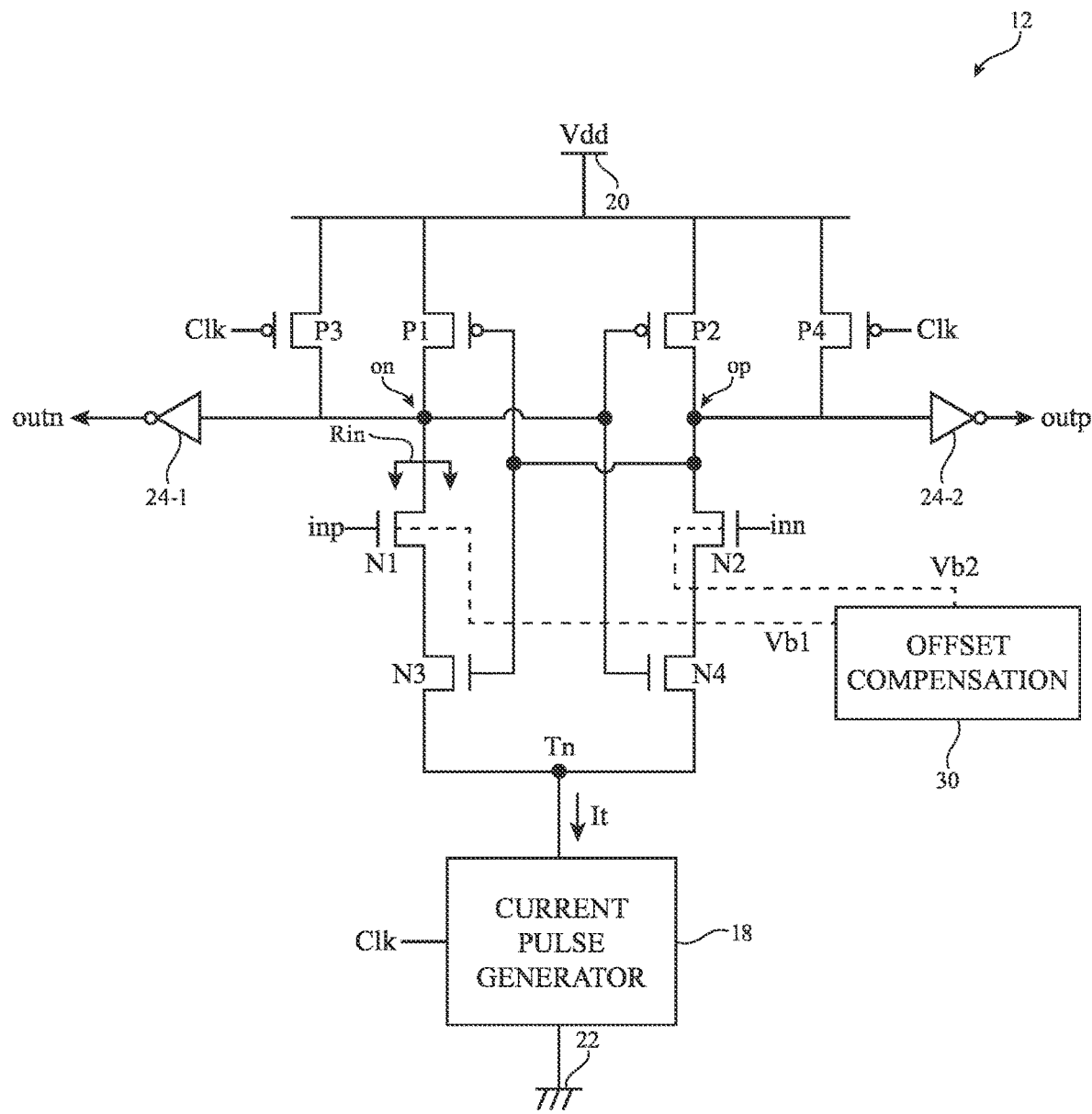
FIG. 7 is a circuit diagram of an illustrative latched comparator having an offset compensation circuit in accordance with some embodiments.

In practice, latched comparator circuitry 12 will exhibit some inherent offset voltage due to manufacturing imperfections resulting in a slight mismatch between the two differential branches. In accordance with certain embodiments, latched comparator circuitry 12 can be provided with an offset compensation circuit such as offset compensation circuit 30 (see, e.g., FIG. 7). As shown in FIG. 7, offset compensation circuit 30 can provide a first body biasing voltage Vb1 to a body (bulk) terminal of first input transistor N1 and can provide a second body biasing voltage Vb2 to the body (bulk) terminal of second input transistor N2.

Body biasing voltages Vb1 and Vb2 can be the same voltage or different voltages. Body biasing voltages Vb1 and Vb2 can be determined using calibration operations (e.g., in a factory setting) or can be determined during normal operation. Body biasing voltages can be fixed voltages or adjustable voltages. The use of body bias voltages Vb1 and Vb2 can provide additional tuning (trimming) capabilities without reducing the speed of the overall latched comparator circuitry. In certain embodiments, offset compensation circuit 30 can be used to selectively provide body biasing voltage Vb1 to the first input transistor or body biasing voltage Vb2 to the second input transistor.

The use of n-type input transistors in the example of FIG. 3 is exemplary. If desired, latched comparator circuitry 12 can be implemented using p-type input transistors. The use of p-type clocking transistors P3 and P4 (sometimes referred to as reset or precharge transistors) is also exemplary. If desired, latched comparator circuitry 12 can be implemented using p-type reset transistors. In general, the polarity of all the transistors with circuitry 12 can be swapped or inverted without departing from the spirit of the present embodiments (e.g., the n-type transistors can be substituted with p-type transistors and vice versa). This is shown in the embodiment of FIG. 8.

Figure 8:
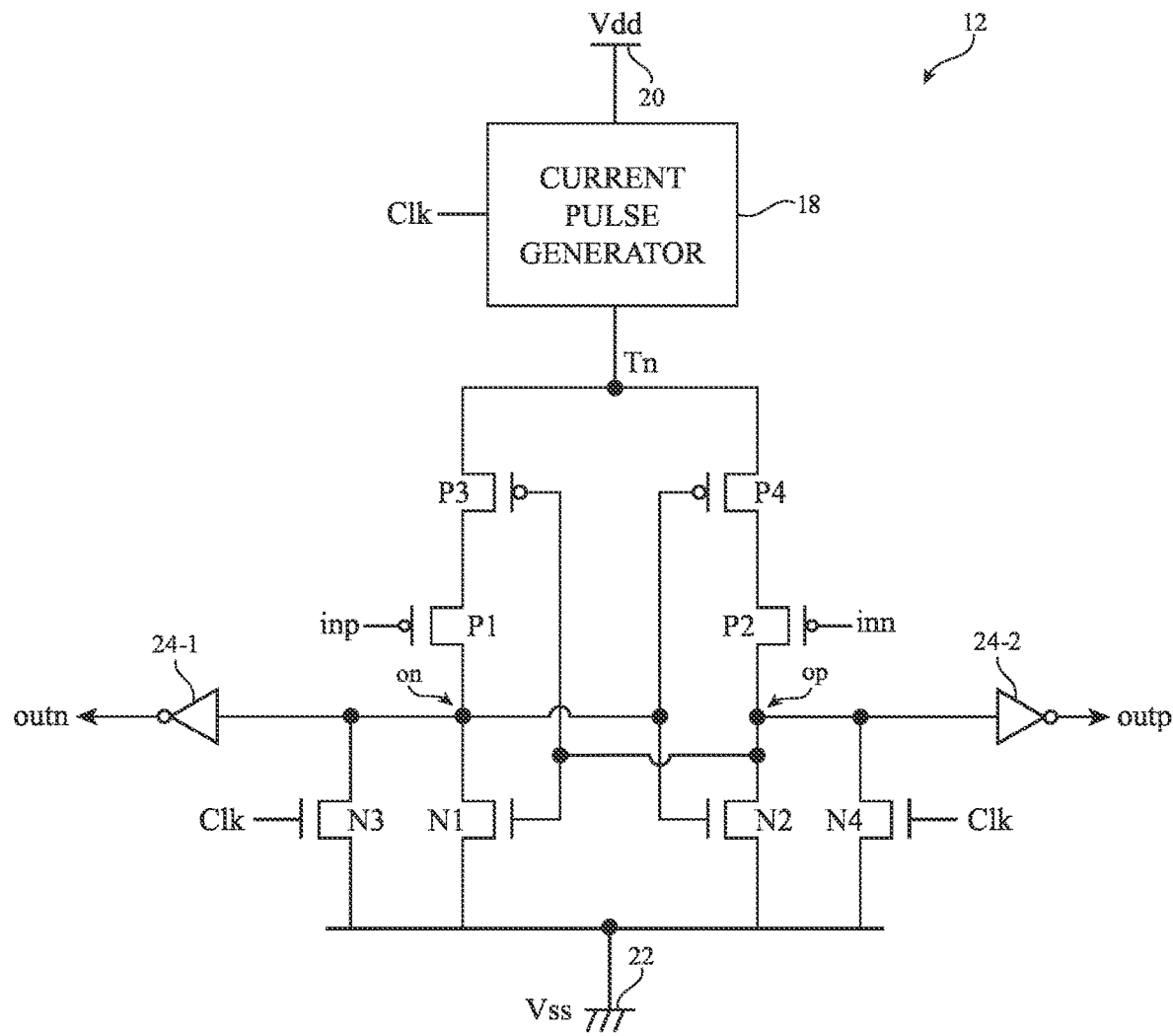
FIG. 8 is a circuit diagram of an illustrative latched comparator having p-type input transistors and n-type clocking transistors in accordance with some embodiments.

As shown in FIG. 8, latched comparator circuitry 12 may include n-type transistors (e.g., n-channel metal-oxide-semiconductor or NMOS devices) such as transistors N1, N2, N3, and N4 and p-type transistors (e.g., p-channel metal-oxide-semiconductor or PMOS devices) such as transistors P1, P2, P3, and P4. Transistor P1 has a gate terminal coupled to a first input terminal inp of latched comparator circuitry 12, whereas transistor P2 has a gate terminal coupled to a second input terminal inn of latched comparator circuitry 12. Input terminals inp and inn collectively serve as a differential input port of latched comparator circuitry 12. Transistors P1 and P2 having gate terminals configured to receive a differential input signal are sometimes referred to and defined herein as input transistors.

Transistor N1 has a drain terminal, a gate terminal, and a source terminal that is coupled to ground line 22. Transistor P3 has a source terminal that is coupled to node Tn, a drain terminal that is coupled to the drain terminal of transistor N1, and a gate terminal that is shorted to the gate terminal of transistor N1. The drain terminal of transistor N1 is connected to a first output node on within circuitry 12. Transistors P3 is coupled in series with transistor N1. Series-connected transistors N1 and P3 having their gates connected are sometimes referred to as a first inverting circuit.

Transistor N2 has a drain terminal, a gate terminal, and a source terminal that is coupled to ground line 22. Transistor P4 has a source terminal that is coupled to node Tn, a drain terminal that is coupled to the drain terminal of transistor N2, and a gate terminal that is shorted to the gate terminal of transistor N2. The drain terminal of transistor N2 is connected to a second output node op within circuitry 12. Transistors P4 is coupled in series with transistor N2. Series-connected transistors P4 and N2 having their gates connected are sometimes referred to as a second inverting circuit.

The gate (input) of the second inverting circuit is coupled to output node on at the first inverting circuit (sometimes referred to as the output node of the first inverting circuit), whereas the gate (input) of the first inverting circuit is coupled to output node op at the second inverting circuit (sometimes referred to as the output node of the second inverting circuit). Arranged in this way, the first and second inverting circuits are sometimes referred to as a pair of cross-coupled inverting circuits forming a latch. Transistors N1 and N2 are sometimes referred to as latch or regeneration (regenerative) pull-down transistors, whereas transistors P3 and P4 are sometimes referred to as latch or regeneration (regenerative) pull-up transistors. Transistors N1, N2, P3, and P4 can be referred to as regenerative latch transistors. The two cross-coupled inverting circuits (e.g., transistors N1, N2, P3 and P4) can also sometimes be referred to collectively as a regenerative latch or a latch portion of circuitry 12.

Transistor N3 may have a source terminal coupled to ground line 22, a drain terminal coupled to output node on, and a gate terminal configured to receive clock signal Clk. Transistor N3 is said to be coupled in parallel with pull-down transistor N1. When clock signal Clk is driven high, n-type transistor N3 is turned on, which pulls output node on down towards ground power supply voltage Vss. Similarly, transistor N4 may have a source terminal coupled to power supply line 22, a drain terminal coupled to output node op, and a gate terminal configured to receive clock signal Clk. Transistor N4 is said to be coupled in parallel with pull-down transistor N2. When clock signal Clk is driven high, n-type transistor N4 is turned on, which pulls output node op down towards ground power supply voltage Vss. Transistors N3 and N4 having gate terminals configured to receive clock signal Clk are sometimes referred to and defined herein as clocking transistors or discharge transistors.

Node on may be coupled to a first output terminal outn of latched comparator circuitry 12 via a first buffer 24-1. Node op may be coupled to a second output terminal outp of latched comparator circuitry 12 via a second buffer 24-2. Output terminals outn and outp may serve collectively as a differential output port for latched comparator circuitry 12. As an example, output buffers 24-1 and 24-1 can be implemented as inverters. As another example, output buffers 24-1 and 24-2 can be implemented as Schmitt triggers (e.g., inverting circuits with hysteresis or memory). The use of Schmitt triggers as output buffers can help reduce leakage in latched comparator circuitry 12. In general, any type of output buffer or driver circuits can be used for 24-1 and 24-2.

Pulse generator such as current pulse generator 18 can be coupled between positive power supply line 20 and node Tn. A current pulse generator can be defined herein as a circuit that produces current pulses. Current pulse generator 18 also has an input configured to receive clock signal Clk. Pulse generator 18 may be configured to generate a current pulse It in response to detecting a rising or falling edge in signal Clk. In the absence of current pulse It, no current can flow into node Tn, which deactivates or disabled latched comparator circuitry 12. Activating latched comparator circuitry 12 only when current It is pulsed high can dramatically reduce the power consumption of circuitry 12.

To reduce the total internal capacitance of latched comparator circuitry 12 without compromising on the amount of current flow, the input transistors P1 and P2 are interposed between the pull-up and pull-down latch transistors. As shown in FIG. 8, input transistor P1 has a source terminal coupled to the drain terminal of pull-up transistor P3 and has a drain terminal coupled to the drain terminal of pull-down transistor N1. Similarly, input transistor P2 has a source terminal coupled to the drain terminal of pull-up transistor P4 and has a drain terminal coupled to the drain terminal of pull-down transistor N2. Coupling transistor P3 at the source terminal of input transistor P1 can help increase the resistance looking into the drain of P1. Similarly, coupling transistor P4 at the source terminal of input transistor P2 can help increase the resistance looking into the drain of P2. Increasing the drain resistance in this way can help mitigate the clock feedthrough effect or lower the clock kickback noise caused by toggling of the clock signal.

The foregoing is merely illustrative and various modifications can be made to the described embodiments. The foregoing embodiments may be implemented individually or in any combination.

What is claimed is:

1. Comparator circuitry comprising:
   a first inverting circuit having a first pull-down transistor and a first pull-up transistor;
   a second inverting circuit having a second pull-down transistor and a second pull-up transistor, the second inverting circuit having an input that is coupled to an output of the first inverting circuit and having an output that is coupled to an input of the first inverting circuit;
   a first input transistor coupled between the first pull-up transistor and the first pull-down transistor and configured to receive an input signal; and
   a current pulse generator having a first terminal coupled to the first and second pull-down transistors, a second terminal coupled to a ground line, and a third terminal configured to receive a clock signal, wherein the current pulse generator is configured to generate a current pulse signal with a pulse width shorter than a high clock phase of the clock signal.

2. The comparator circuitry of claim 1, further comprising:
   a second input transistor coupled between the second pull-up transistor and the second pull-down transistor and configured to receive the input signal.

3. The comparator circuitry of claim 2, wherein:
   the first input transistor has a first source-drain terminal coupled to the first pull-up transistor, a second source-drain terminal coupled to the first pull-down transistor, and a gate terminal configured to receive the input signal; and
   the second input transistor has a first source-drain terminal coupled to the second pull-up transistor, a second source-drain terminal coupled to the second pull-down transistor, and a gate terminal configured to receive the input signal.

4. The comparator circuitry of claim 3, further comprising:
   a first reset transistor having a first source-drain terminal coupled to a power supply line, a second source-drain terminal coupled to the first source-drain terminal of the first input transistor, and a gate terminal configured to receive the clock signal; and
   a second reset transistor having a first source-drain terminal coupled to the power supply line, a second source-drain terminal coupled to the first source-drain terminal of the second input transistor, and a gate terminal configured to receive the clock signal.

5. The comparator circuitry of claim 4, wherein the first and second reset transistors comprise p-type transistors.

6. The comparator circuitry of claim 4, further comprising:
   a first output buffer coupled to the second source-drain terminal of the first reset transistor; and
   a second output buffer coupled to the second source-drain terminal of the second reset transistor.

7. The comparator circuitry of claim 6, wherein the first and second output buffers comprise Schmitt triggers.

8. The comparator circuitry of claim 1, wherein the current pulse generator comprises:
   a first tail transistor having a first source-drain terminal that is coupled to a source terminal of the first pull-down transistor and to a source terminal of the second pull-down transistor, a second source-drain terminal, and a gate terminal that is configured to receive the clock signal;
   a second tail transistor having a first source-drain terminal that is coupled to the second source-drain terminal of the first tail transistor, a second source-drain terminal that is coupled to the ground line, and a gate terminal that is coupled to receive an inverted version of the clock signal; and a capacitor having a first terminal coupled to the first source-drain terminal of the second tail transistor and having a second terminal coupled to the second source-drain terminal of the second tail transistor.

9. The comparator circuitry of claim 1, wherein the current pulse generator comprises:

a tail transistor having a first source-drain terminal that is coupled to a source terminal of the first pull-down transistor and to a source terminal of the second pull-down transistor, a second source-drain terminal, and a gate terminal that is configured to receive a series of clock pulses triggered by the clock signal; and a current sink coupled to the second source-drain terminal of the tail current.

10. The comparator circuitry of claim 2, further comprising:

an offset compensation circuit configured to output a first bias voltage to a body terminal of the first input transistor and configured to output a second bias voltage to a body terminal of the second input transistor.

11. The comparator circuitry of claim 1, wherein the pulse width of the current pulse signal is more than two times smaller than the high clock phase of the clock signal.

12. The comparator circuitry of claim 1, wherein the pulse width of the current pulse signal is more than ten times smaller than the high clock phase of the clock signal.

13. A differential circuit comprising:

a latch having a pair of cross-coupled inverting circuits, wherein a first inverting circuit in the pair of cross-coupled inverting circuit includes a first n-type transistor and a first p-type transistor, and wherein a second inverting circuit in the pair of cross-coupled inverting circuits includes a second n-type transistor and a second p-type transistor; and a first input transistor coupled between the first n-type transistor and the first p-type transistor in the first inverting circuit;

a second input transistor coupled between the second n-type transistor and the second p-type transistor in the second inverting circuit; and a current pulse generator coupled to source terminals of the first and second n-type transistors and configured to receive a clock signal, wherein the current pulse generator is configured to output a current pulse that is less than 10% of a period of the clock signal.

14. The differential circuit of claim 13, wherein the first and second input transistors comprise n-type transistors.

15. The differential circuit of claim 14, further comprising:

a first p-type precharge transistor coupled in parallel with the first p-type transistor and configured to receive a clock signal; and a second p-type precharge transistor coupled in parallel with the second p-type transistor and configured to receive the clock signal.

16. The differential circuit of claim 13, further comprising:

a control circuit configured to output a first bias voltage to a bulk terminal of the first input transistor or to output a second bias voltage to a bulk terminal of the second input transistor.

17. A comparator comprising:

a first input transistor having a gate terminal configured to receive an input signal;

a second input transistor having a gate terminal configured to receive the input signal;

a first pull-down transistor having a drain terminal coupled to a source terminal of the first input transistor;

a second pull-down transistor having a drain terminal coupled to a source terminal of the second input transistor and having a source terminal coupled to a source terminal of the first pull-down transistor; and a pulse generator coupled to the source terminals of the first and second pull-down transistors and configured to receive a clock signal having a first duty cycle, wherein the pulse generator is configured to output a pulse having a second duty cycle that is at least five times shorter than the first duty cycle.

18. The comparator of claim 17, further comprising:

a first pull-up transistor having a source terminal coupled to a power supply line, a drain terminal coupled to a drain terminal of the first input transistor, and a gate terminal coupled to a gate terminal of the first pull-down transistor; and a second pull-up transistor having a source terminal coupled to the power supply line, a drain terminal coupled to a drain terminal of the second input transistor, and a gate terminal coupled to a gate terminal of the second pull-down transistor.

19. The comparator of claim 18, further comprising:

a first reset transistor coupled in parallel with the first pull-up transistor and configured to receive the clock signal; and a second reset transistor coupled in parallel with the second pull-up transistor and configured to receive the clock signal.

20. The comparator of claim 19, wherein the pulse generator is configured to output the pulse in response to detecting an edge in the clock signal.

* * * * *